(12) United States Patent
Patra et al.

(10) Patent No.: US 12,726,004 B2
(45) Date of Patent: Sep. 1, 2026

(54) PATTERNING OF DIODE/SUBSTRATE INTERFACE TO REDUCE THERMAL LENSING

(71) Applicant: Lawrence Livermore National Security, LLC, Livermore, CA (US)

(72) Inventors: Susant Patra, Brentwood, CA (US); Robert J. Deri, Pleasanton, CA (US)

(73) Assignee: Lawrence Livermore National Security, LLC, Livermore, CA (US)

(*) Notice: Subject to any disclaimer, the term of this patent is extended or adjusted under 35 U.S.C. 154(b) by 896 days.

(21) Appl. No.: 17/449,781

(22) Filed: Oct. 1, 2021

(65) Prior Publication Data

US 2023/0106189 A1 Apr. 6, 2023

(51) Int. Cl.
*H01S 5/024* (2006.01)
*H01S 5/40* (2006.01)

(52) U.S. Cl.
CPC ........ *H01S 5/4031* (2013.01); *H01S 5/02469* (2013.01)

(58) Field of Classification Search
CPC ............. H01S 5/02469; H01S 5/02476; H01S 5/02484; H01S 5/02492; H01S 5/4031; H01S 5/423; H01S 5/022–0239
See application file for complete search history.

(56) References Cited

U.S. PATENT DOCUMENTS 6,352,873 B1 * 3/2002 Hoden ................ H01S 5/02365 438/31
6,757,314 B2 6/2004 Kneissl et al.
9,054,482 B1 * 6/2015 Li ......................... H01S 5/4025
2005/0195882 A1 9/2005 Wang et al.
2006/0018355 A1 * 1/2006 Feitisch ................ H01S 5/4025 372/50.12
2008/0037602 A1 * 2/2008 Thiagarajan ........ H01S 5/02345 438/34
2010/0133505 A1 * 6/2010 Takao ................. H10H 20/018 257/E21.085
2017/0025815 A1 1/2017 Jiang et al.
2017/0222388 A1 * 8/2017 Ma ....................... F16J 15/0893
2021/0384701 A1 * 12/2021 Ono ...................... H01S 5/0234
2022/0376467 A1 * 11/2022 Modak ................. H01S 5/4043

FOREIGN PATENT DOCUMENTS

KR 20150115928 A 10/2015
WO WO-2020174949 A1 * 9/2020 ............ H01S 5/022

OTHER PUBLICATIONS

International Search Report and Written Opinion dated Apr. 28, 2023 in Application No. PCT/US2022/077139 in 12 pages.

* cited by examiner

*Primary Examiner* — Minsun O Harvey
*Assistant Examiner* — Fernanda Adriana Camacho Alanis
(74) *Attorney, Agent, or Firm* — Knobbe, Martens, Olson & Bear, LLP

(57) ABSTRACT

Thermal management may in some cases improve the optical output of a semiconductor laser diode array. For example, providing gaps such as air gaps, at suitable locations may influence the temperature distribution of laser diodes in a laser diode array and curtail thermal lensing, which may in turn decrease beam divergence and increase delivered power.

20 Claims, 9 Drawing Sheets

14
X
18
Y
Z
16
28
20
26
58
20
28
54
36
24
46
40
22
44
52
36
26

PATTERNING OF DIODE/SUBSTRATE INTERFACE TO REDUCE THERMAL LENSING

FEDERALLY SPONSORED RESEARCH OR DEVELOPMENT

This invention was made with Government support under Contract No. DE-AC52-07NA27344 awarded by the United States Department of Energy. The Government has certain rights in the invention.

BACKGROUND

Field

The present disclosure relates generally to laser diode arrays, and more specifically to the interface between the laser diodes and a substrate on which the laser diodes are mounted that operates as a heat sink.

Description of the Related Art

A variety of different types of lasers employ laser diode arrays to provide optical pumping. Examples include fiber lasers, diode-pumped solid-state lasers, and diode-pumped gas lasers. The output of such lasers may depend on the pumping efficiency of the diode array. For example, increasing the brightness of the laser diode arrays used for pumping may potentially enhance the optical output of such diode pumped lasers.

A particular challenge for laser diodes, however, is the significant increase in the divergence of the optical beam output by the laser diodes when the laser diodes are operated at high power output. This divergence is believed to be caused by thermal lensing, which is induced by waste heat in the semiconductor laser that spreads and creates a thermal gradient. Variation in the semiconductor temperature with location in the semiconductor causes a change in refractive index with position that forms a thermal lens. The resultant gradient in thermal index has a lens-like effect that produced divergence in the output beam. The increased divergence of the beam results in a (e.g., proportional) decrease in laser diode brightness.

SUMMARY

Reducing the divergence of the semiconductor laser diodes may increase the brightness of the laser diodes and improve the delivery of the optical power from the laser diodes to the gain media of diode pumped lasers. The output power of the diode pumped lasers as well as efficiency may thereby be enhanced. Accordingly, countering thermally induced lensing, which produces beam divergence of the laser diodes, may be beneficial.

Various designs described herein likewise endeavor to control the distribution of heat from the laser in a manner so as to reduce thermal lensing. For example, without subscribing to any scientific theory, instead of having a large temperature difference within the laser diode, which produces a similar index gradient in the semiconductor, the heat flow from the laser can be restricted via thermal isolation causing the temperature falloff within the laser emitter to be reduced. In various implementations described herein, for example, air gaps or open spaces or open regions are created to provide thermal isolation and curtail the temperature falloff and thermal gradients. Such air gaps, open spaces or open regions may be formed by patterning a substrate on which the laser diode array is mounted that serves as a heat sink, thereby forming the air gaps, open spaces, or open regions to restrict heat flow. Similarly, metal that is used to provide electrical and/or thermal contact to laser diodes may be patterned to form the air gaps or open spaces.

A variety of different configurations and designs are disclosed herein. Example embodiments described herein have several features, no single one of which is indispensable or solely responsible for their desirable attributes. Some example systems and methods are provided below.

Example 1: A laser diode array comprising:

- a semiconductor multilayer comprising a plurality of emission regions arranged in a linear array, consecutive emission regions separated from each other by non-emitting regions of said semiconductor multilayer;
- a metal layer; and
- a substrate disposed with respect to said semiconductor multilayer such that said metal layer is between said semiconductor multilayer and said substrate, said substrate providing a heat sink for at least portions of said semiconductor multilayer;
- a plurality of gaps between said semiconductor multilayer and said substrate, said gaps disposed between contact regions, respective ones of said contact regions forming electrical contact with respective ones of said emission regions of said semiconductor multilayer, respective ones of said contact regions forming thermally conductive pathways with respective ones of said emission regions, individual ones of said thermally conductive pathways being thermally isolated by adjacent ones of said gaps.

Example 2: The laser diode array of Example 1, wherein said gaps comprises air gaps.

Example 3: The laser diode array of Example 1, wherein said metal layer comprises a solder layer.

Other designs and configurations are possible.

BRIEF DESCRIPTION OF THE DRAWINGS

The drawings described herein are for illustrative purposes only of selected embodiments and not all possible implementations, and are not intended to limit the scope of the present disclosure.

FIG. 3B shows the gaps or open regions or spaces (e.g., air gaps) produced by the raised regions and the lower regions of the patterned substrate as well as a metal layer between the patterned substrate and the semiconductor multilayer.

FIG. 4 also show the sidewalls of the raised regions as tapered.

FIG. 6B shows the gaps (e.g., air gaps) produced between the semiconductor multilayer and the substrate by the strips of metal having gaps/air gaps therebetween.

DETAILED DESCRIPTION

As discussed above, thermal management may in some cases improve the optical output of a semiconductor laser diode array. For example, providing gaps, open spaces or open regions, e.g., air gaps, at suitable locations may influence the temperature distribution of laser diodes in a laser diode array and curtail thermal lensing, which may in turn decrease beam divergence.

Figure 1:
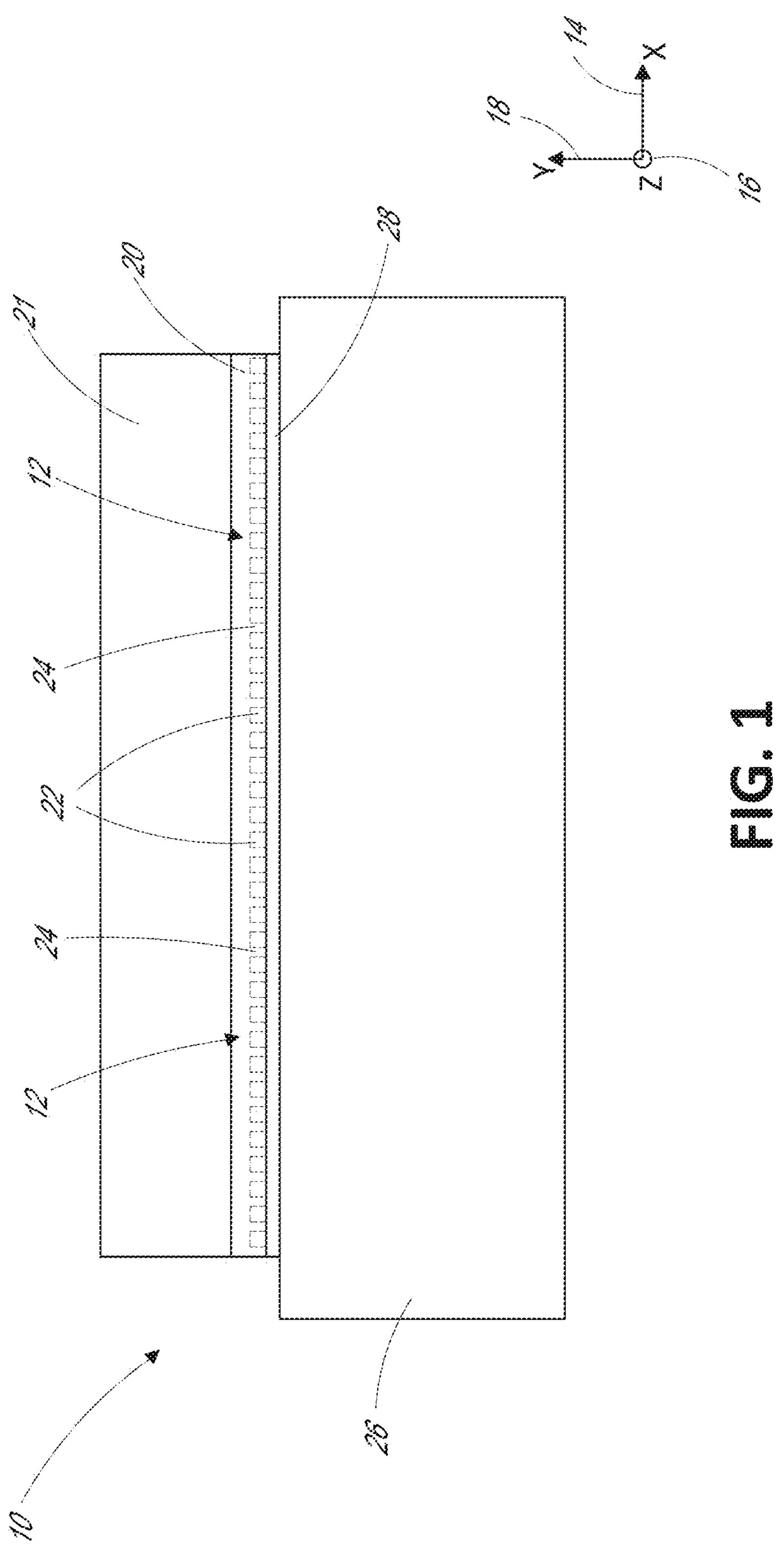
FIG. 1 is a schematic cross-sectional view of an example laser diode array comprising a semiconductor multilayer comprising a plurality of laser diode emitters that is mounted on a thermally conductive substrate that serves as a heat sink.

A linear laser diode array 10 may comprise a plurality of laser diodes 12 arranged along a transverse axis as illustrate in FIG. 1; the transverse axis being shown parallel to an x-axis 14 in FIG. 1. Different laser's 12 of the array 10 may output separate beams in the forward longitudinal direction orthogonal to the transverse axis (which is parallel to a z-axis 16 shown). Individual laser beams (not shown) may have a beam profile that is non-rotationally symmetric, for example, elliptical in cross-section. In some cases, the elliptical beam is narrower in a direction along the transverse axis (parallel to the x-axis 14), along which the laser diodes 12 are arranged (referred to as the slow axis) and wider in a direction perpendicular that is referred to as the fast axis (which is parallel to the y-axis 18 shown).

The laser diode array 10 includes a semiconductor multilayer 20 comprising semiconductor material disposed on a substrate 21. The semiconductor multilayer 20 comprises a plurality of layers (e.g., a plurality of semiconductor layers). The plurality of layers may comprise a plurality of epitaxial layers or epitaxial grown layers (e.g., epitaxial semiconductor layers) that may be epitaxially grown on the substrate 21 (e.g., a semiconductor substrate). The number of layers may be larger or smaller than the number depicted in the FIG. 1. The semiconductor multilayer 20 is shown to include a plurality of emission regions 22 coinciding with the positions of the individual laser diodes or emitters 12. As illustrated in FIG. 1, the emission regions or emitters 22 are arranged in a linear array, e.g., along the transvers axis that is parallel to the x-axis 14. Consecutive emission regions or emitters 22 are separated from each other by non-emitting regions 24 of the semiconductor multilayer 20. The semiconductor multilayer 20 may comprise a heterostructure comprising a plurality of sublayers, e.g., of differently doped semiconductor and/or semiconductor having different composition. The semiconductor may comprise III-V semiconductor material in certain implementations. The substrate 21 on which the semiconductor layer is disposed may comprise semiconductor, for example, III-V semiconductor material, such as, for example, gallium arsenide (GaAs), indium phosphide (InP), or gallium nitride (GaN) or may comprise non-semiconductor materials such as, for example, sapphire. Other materials may be employed as the substrate 21. Optical confinement on the axis perpendicular to the layer planes (e.g., parallel to y-axis 18) may be provided by varying the semiconductor refractive indices among the various sublayers. Optical confinement in the direction parallel to the layer planes and perpendicular to the optical emission axis (e.g., parallel to x-axis 14) may be provided by (1) controlling where current is injected into the structure to provide lasing gain ("gain guiding") by varying the resistance of some semiconductor multilayers or removing certain low resistance layers outside the emission regions, (2) using semiconductor material with a lower refractive index outside the emission regions, and/or (3) removing semiconductor material outside the emission regions to create a layer structure with a lower "effective refractive index". For example, the semiconductor multilayer 20 may be etched to removed material in the non-emitting regions 24 between the emission regions 22 to form "mesas", which correspond to the emission regions. Low conductive or insulting material such as silicon dioxide, silicon nitride, or insulating semiconductor or combinations thereof can be included in the regions between the mesas, e.g., in the non-emitting regions 24 between the emission regions 22.

The laser diodes 12 may comprise p and n portions that form a junction therebetween. In some implementations, the semiconductor multilayer 20 comprises p-doped semiconductor layers on one side of the junction and n-doped semiconductor layers on the other side of the junction. In some implementations, the semiconductor substrate 21 on which the semiconductor layers of the semiconductor multilayer 20 are formed comprises n-dopes semiconductor. Other configurations are possible. However, in some implementations described herein, the side of the laser diode with the semiconductor substrate 21 is referred to the n-side while the opposite side of the laser diode is referred to as the p-side. The arrangement, however, may be different for different designs.

The semiconductor multilayer 20 is attached to a substrate 26 that may operate as a heat sink for at least portions of the semiconductor multilayer 20. Accordingly, the heat sink substrate 26 comprises a material that is thermally conducting. This substrate may comprise a wide range of material such as metals, composites, ceramics, semiconductors, and crystalline material (e.g., diamond). The substrate/heat sink 26 may comprise metal such as copper or copper-tungsten alloys in some implementations although other metals and/or other materials such as, for example, aluminum nitride, beryllium oxide, silicon carbide, silicon, or diamond may be employed, although other materials may be used in different implementations. The heat sink substrate 26 comprises a material that is thermally conducting. In some designs as illustrated, the substrate 26 has a larger size and/or mass than the semiconductor multilayer 20 and/or semiconductor multilayer 20 and the substrate 21 (e.g., semiconductor substrate) on which the semiconductor multilayer is disposed. In some designs, for example, the heat sink substrate 26 is thicker or wider than the semiconductor multilayer 20, or both thicker and wider and/or is thicker or wider than the semiconductor multilayer 20 in combination with the substrate 21 on which it is formed, or both thicker and wider. In some designs, the thickness of the semiconductor multilayer 20 along the y-direction (parallel to y-axis 18) may be in a range of from 0.3 microns to 7 microns while the thickness of the heat sink substrate 26 in the y-direction (parallel to the y-axis 18) may be in a range from 100 microns to 1 millimeter or several millimeters (e.g., 2 millimeters or more), although other sizes are possible. The substrate 21 (e.g., semiconductor substrate) on which the semiconductor multilayer 20 is formed may have a thickness of from 80 to 150 microns in some implementations. The width of the semiconductor emission region 22 along the x-direction (e.g., parallel to the x-axis 14) may, for example, be in a range from 20 microns to 300 microns, and the width of the semiconductor array (comprising multiple emitters) may, for example, be in a range from 250 microns to 1 centimeter. Similarly, the width of the semiconductor multilayer 20 and/or the substrate 21 for the semiconductor multilayer 20 may be, for example, 250 microns to 1 centimeter. The heat sink/substrate 26 width may be, for example, be from 100 microns to 1 mm wider than the width of the semiconductor multilayer 20 and/or substrate 21 in various designs. Other sizes, larger or smaller, are possible for any of or any combination of these dimensions.

A metal layer 28 may be disposed between the heat sink substrate 26 and the semiconductor multilayer 20. This metal layer 28 may provide a thermally conductive medium for transfer of heat from the semiconductor multilayer 20 to the substrate 26. In various implementations, this metal layer 28 may comprise an electrically conductive material that provides electrical contact to the laser diodes 12. In some implementations, this metal layer 28 may comprise a solder layer comprising solder such as indium or gold-tin eutectic, although other materials may be use. This metal layer 28 (e.g., solder layer) may be thinner or thicker than the semiconductor multilayer 20 and/or the substrate 26 in various implementations and may have a thickness in a range from 1 micron to 30 microns in some cases although the thickness may be larger or smaller.

As discussed above, operating the laser diode array 10 at high power may cause the laser diodes 12 and the emission regions 22 to heat up. This heat may flow into the non-emitting regions 24 in the semiconductor multilayer 20 between adjacent emission regions 22. Both the light emitting regions 22 and the non-emitting regions 24 may be in thermal contact with the heat sink such the heat flows to the heat sink through the solder layer. The result of this arrangement may be a temperature gradient along the x direction (e.g., parallel to the x-axis 14) with a significant fall-off in temperature within the emission region or emitter 22 including in the transverse direction (e.g., parallel to the slow axis or x-axis in FIG. 1). The decreasing temperature with lateral position will produce a corresponding change in index of refraction with lateral distance from the center of the emission region 22. This spatially varying refractive index can induce refraction that increases the divergence of the light beams output from the emission regions 22 of the laser diode array 10.

Figure 2:
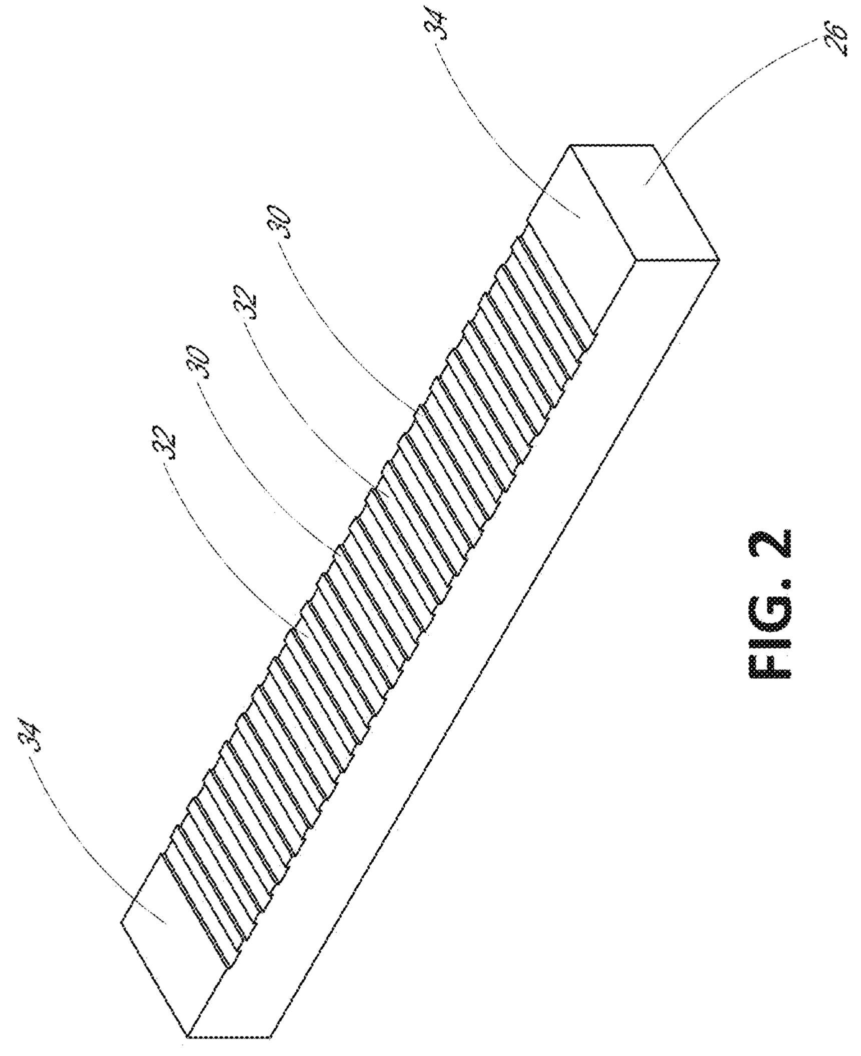
FIG. 2 is perspective view of thermally conductive substrate/heat sink that is patterned to provide raised regions separated by lower regions so as to produce gaps or open regions or spaces (e.g., air gaps) located between the raised regions above the lower regions when the patterned substrate is attached to a semiconductor multilayer of a laser diode array.

As discussed above, to control the temperature in a manner to reduce thermal lensing, gaps such as air gaps or open spaces or open regions can be created beneath the non-emission regions 24. Without subscribing to any scientific theory, such gaps or air gaps may reduce the flow of heat from the non-emission regions 24 directly into the substrate 26, which operates as a heat sink. Thus, in some implementations, the air gaps may provide some thermal isolation and cause the falloff of temperature within the emission regions 22 to be less. One approach to forming such gaps or air gaps is by patterning the substrate/heat sink 26 to provide raised regions 30 separated by lower regions 32 on the surface 34 of the substrate as shown in FIG. 2. The air gaps or open spaces or open regions may coincide with the lower regions 32 when the substrate 26 is attached to the semiconductor multilayer 20.

The raised regions 30 and lower regions 32 may be formed in the substrate 26 by machining, laser cutting, electro-discharge machining (EDM), etching, metal injection molding or other patterning or fabrication methods. In some implementations, the raised regions 30 have a height (e.g., average height) in the range from 0.1 micron to 10 microns above the lower regions 32, although the height of the lower regions may be larger or smaller. In some implementations, the raised regions 30 have a width (e.g., average width) in the range from 10 microns to 200 microns, although the width of the raised regions may be larger or smaller. In some implementations, the lower regions 32 have a width (e.g., average width) in the range from 10 microns to 400 microns, although the width of the lower regions may be larger or smaller. In some implementations, the raised regions 30 have a pitch in the range from 10 to 50 microns, although the pitch of the raised regions can be larger or smaller (e.g., from 10 to 600 microns or larger or smaller). Similarly, in some implementations, the lower regions 32 have a pitch in the range from 10 to 100 microns, although the pitch of the lower regions can be larger or smaller (e.g., from 10 to 600 microns or larger or smaller).

In some designs, the width and/or pitch of the lower regions 32 is similar to, approximates or matches the respective width and/or pitch of the non-emitting regions 24 of the semiconductor multilayer 20 between the emission regions 22 of the semiconductor multilayer. Similarly, in some designs the width and/or pitch of the raised regions 30 is similar to, approximates, or matches the respective width and/or pitch of the emitting regions 22 (or mesas) of the semiconductor multilayer 20 between the non-emitting regions 24 of the semiconductor multilayer.

Figures 3A, 3B:
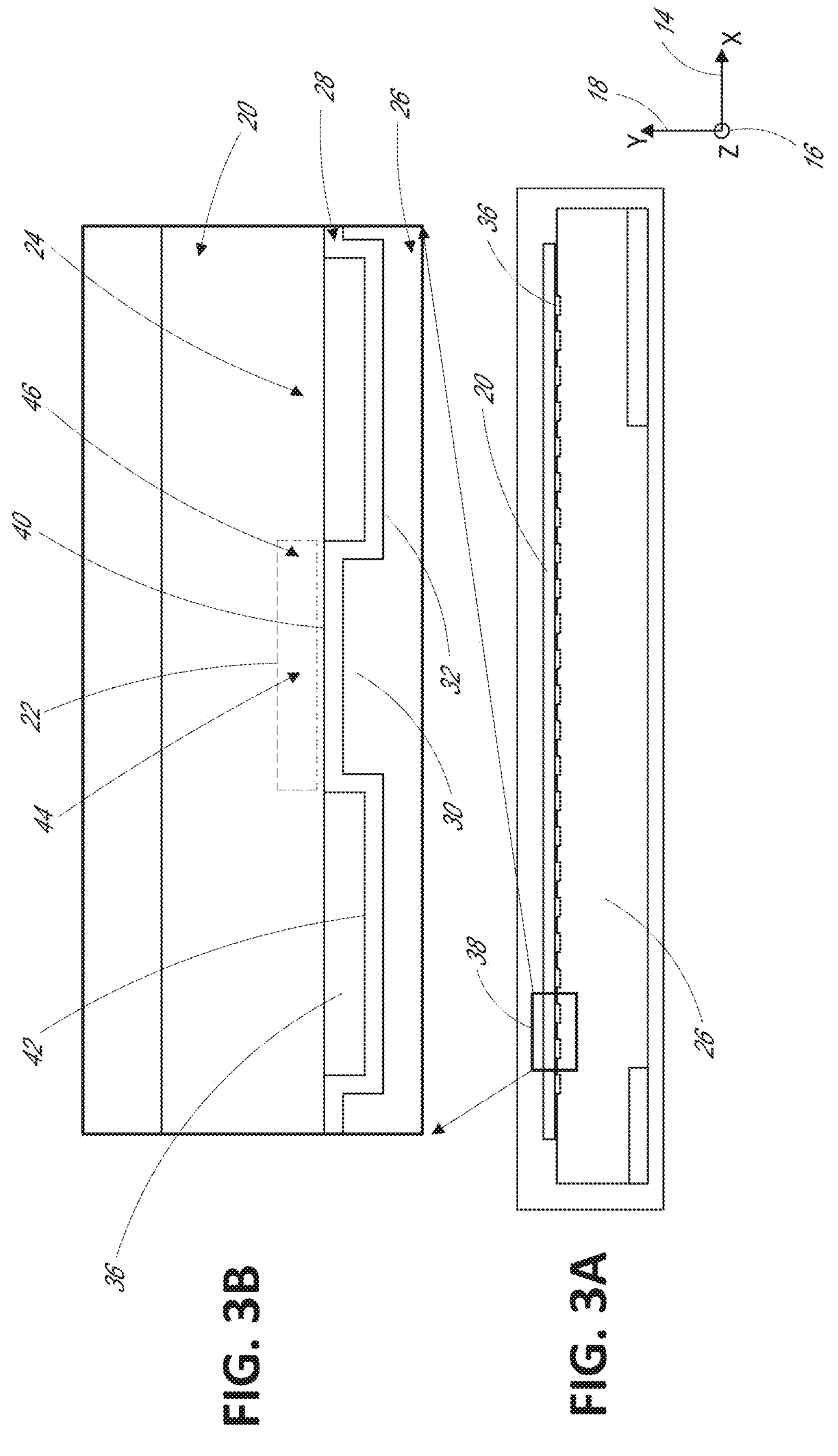
FIG. 3A is a schematic cross-sectional view of the semiconductor multilayer of a laser diode array attached to a patterned substrate/heat sink such as shown in FIG. 2 so as to produce gaps (e.g., air gaps) between the semiconductor multilayer and the patterned substrate/heat sink.
FIG. 3B is a close-up schematic cross-sectional view of the semiconductor multilayer attached to the patterned substrate.

As shown in FIG. 3A, when the substrate 26 operating as a heat sink is attached to the semiconductor multilayer 20, gaps or open spaces or open regions 36 are formed between the substrate and the semiconductor multilayer. (See also FIG. 3B, which shows a close-up of a portion 38 of laser diode array 12.) In various implementations, these gaps or open spaces or open regions 36 and/or the lower regions 32, or at least portions thereof, are laterally aligned with, for example, are beneath the non-emitting regions 24, or at least portions thereof. Similarly, the raised regions 30 of the patterned substrate 26, or at least a portion thereof, are laterally aligned with, for example, are beneath the emission regions 22 or at least a portion thereof. Accordingly, in some designs the width and/or pitch of the gaps, open spaces, or open regions 36 are similar to, approximates, or matches the respective width and/or pitch of the non-emitting regions 24 of the semiconductor multilayer 20 between the emission regions 22 of the semiconductor multilayer. Likewise, in some designs the width and/or pitch of the raised regions 30 are similar to, approximates, or matches the respective width and/or pitch of the emission regions 22 (or mesas) of the semiconductor multilayer 20 between the non-emitting regions 24 of the semiconductor multilayer.

As illustrated in FIG. 3B, in some implementations, the metal layer 28 between the substrate 26 and the semiconductor multilayer 20 conformally fits on and/or is in contact with the raised and lower regions 30, 32 of the substrate 26 such that the gaps, open spaces, or open regions 36 are between the metal layer and the semiconductor multilayer. For example, the gap 36 may be formed between semiconductor multilayer 20 and the metal layer 28 that contacts and is on the lower region 32 of the substrate 26. The metal layer 28 may also be formed on and contact the raised region 30. Electrical and/or thermal contact may be formed with the laser diode 12 and emission region 22 (e.g., mesa) of the semiconductor multilayer 20 via a contact region 40 of the metal layer 28 formed on and contacting the raised region 30 of the patterned substrate 26. Electrical current and/or voltage may be applied to the laser diode 12 through this contact region 40 of the metal layer 28. Similarly, heat may flow from the emission region 22 of the semiconductor multilayer 20 through this contact region 40 of the metal layer 28 above the raised region 30 of the patterned substrate 26. Conversely, the portion 42 of the metal layer 28 on the lower region 32 of the patterned substrate 26 is not in contact with the non-emitting region 24 of the semiconductor multilayer 20, which it is beneath. Instead, the gap, open space, or open region (e.g., air gap) separates the portion 42 of the metal layer 28 on the lower region 32 of the patterned substrate 26 from the non-emitting region 24 of the semiconductor multilayer 20.

Without subscribing to any scientific theory, less heat flows from the non-emitting region 24 of the semiconductor multilayer 20 through the gap, open space, or open region 36 to the portion 42 of the metal layer 42 on the lower region 32. As a result, again without subscribing to any particular scientific theory, the temperature falloff from the center 44 of the emission region 22 to the edge 46 of the emission region may be less than if the gap, open space, or open region 36 was not present and the metal layer 28 directly contacted the non-emitting region 24 of the semiconductor multilayer 20 and provided more cooling of the non-emitting region. As shown, this contact region 40 comprises a surface of the metal layer 28 that contacts the semiconductor multilayer 20. The gaps, open spaces or open regions, e.g., air gaps, are on opposite sides of this contact region 40. Electrical current and/or voltage may be applied to the laser diode 12 through this contact region 40 of the metal layer 28. Similarly, heat may flow from the emission region 22 of the semiconductor multilayer 20 through this contact region 40 of the metal layer 28. The gaps, open spaces, or open regions (e.g., air gaps), may provide thermal isolation wherein heat flows via conduction from the emitter or emission region 22 through the contact region 40 and the metal layer 28 while the gaps, open spaces, or open regions operate as barriers to limit conduction from the non-emitting regions 24 directly to the substrate 26.

Figure 4:
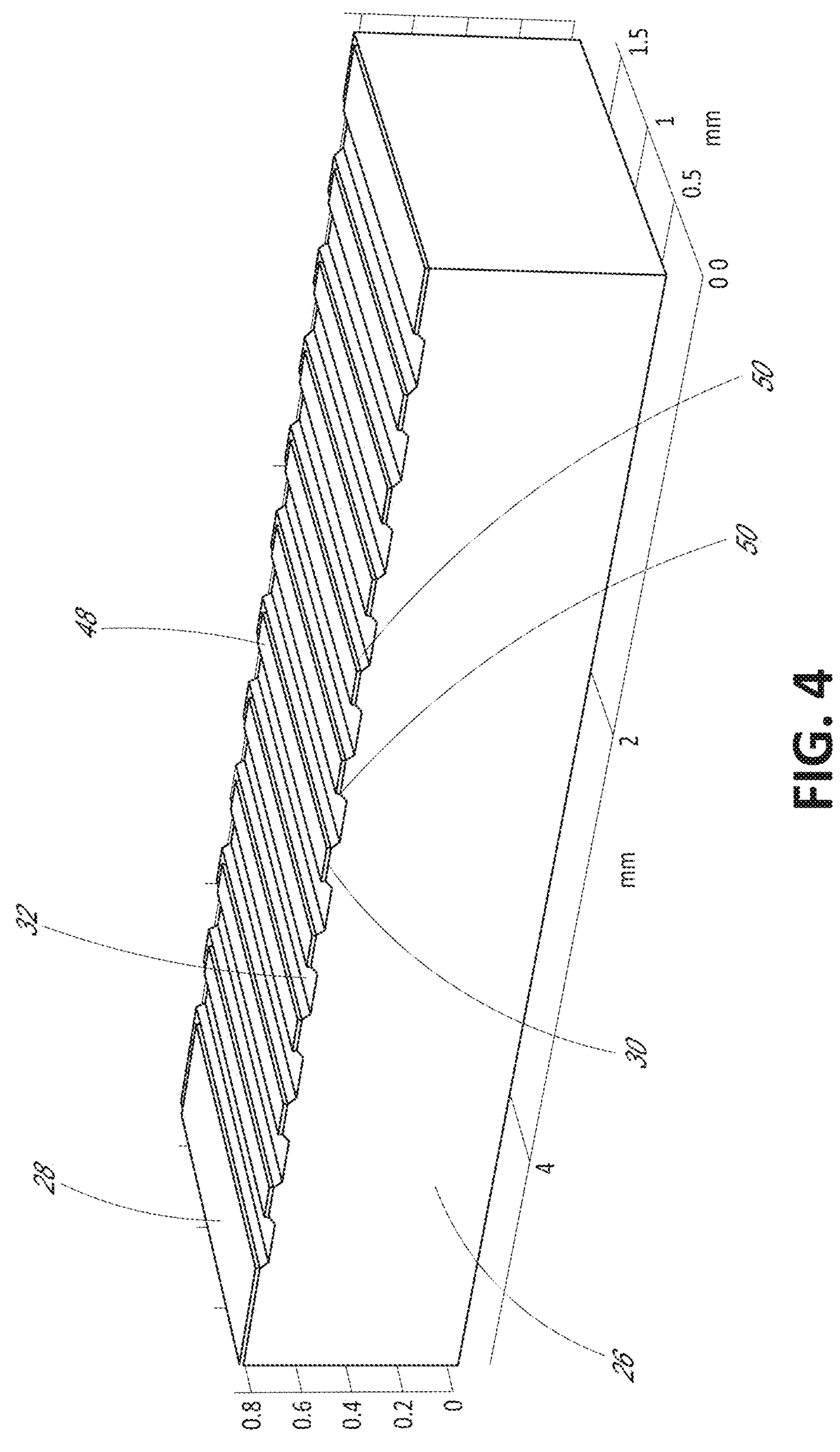
FIG. 4 is a schematic perspective view of a substrate patterned to provide raised regions separated by lower regions having a metal layer thereon.

The metal layer 28 need not be a conformal layer that is conformally deposited on the surface 34 of the substrate 26 such that that metal layer conformally fits into the lower regions 32 of on surface of the substrate between the raised regions 30 as well as on the raised region. FIG. 4, for example, illustrates an implementation wherein the metal layer 28 is formed on the raised regions 30 but is not included on the lower regions 32. Accordingly, in some configurations most of the metal layer 28 may be on the raised regions 30 in comparison to the lower regions 32. Likewise, for one or more of the lower regions 32, if not most or all the lower regions 32, the surface 34 of the substrate 26 is exposed and/or is not covered by the metal layer 28. Or at least most of the surface 34 of the lower region(s) 32 is not covered by the metal layer 28. As a result, metal strips 48 are disposed on the raised regions 30 of the substrate 26. Also, as illustrated in FIG. 4, the surface 34 of the substrate 26 can include sloped sidewalls 50 on the raised regions 30 of the substrate surface. The sidewalls 50 may be formed by wet etching, which may result in sloped sidewalls. For some deposition processes used to deposit additional layers (metals, insulators), a slope facilitates obtaining a continuous deposited film (e.g., little or no breaks). In various implementations, these sidewalls 50 are not covered by the metal layer 28.

Figure 5:
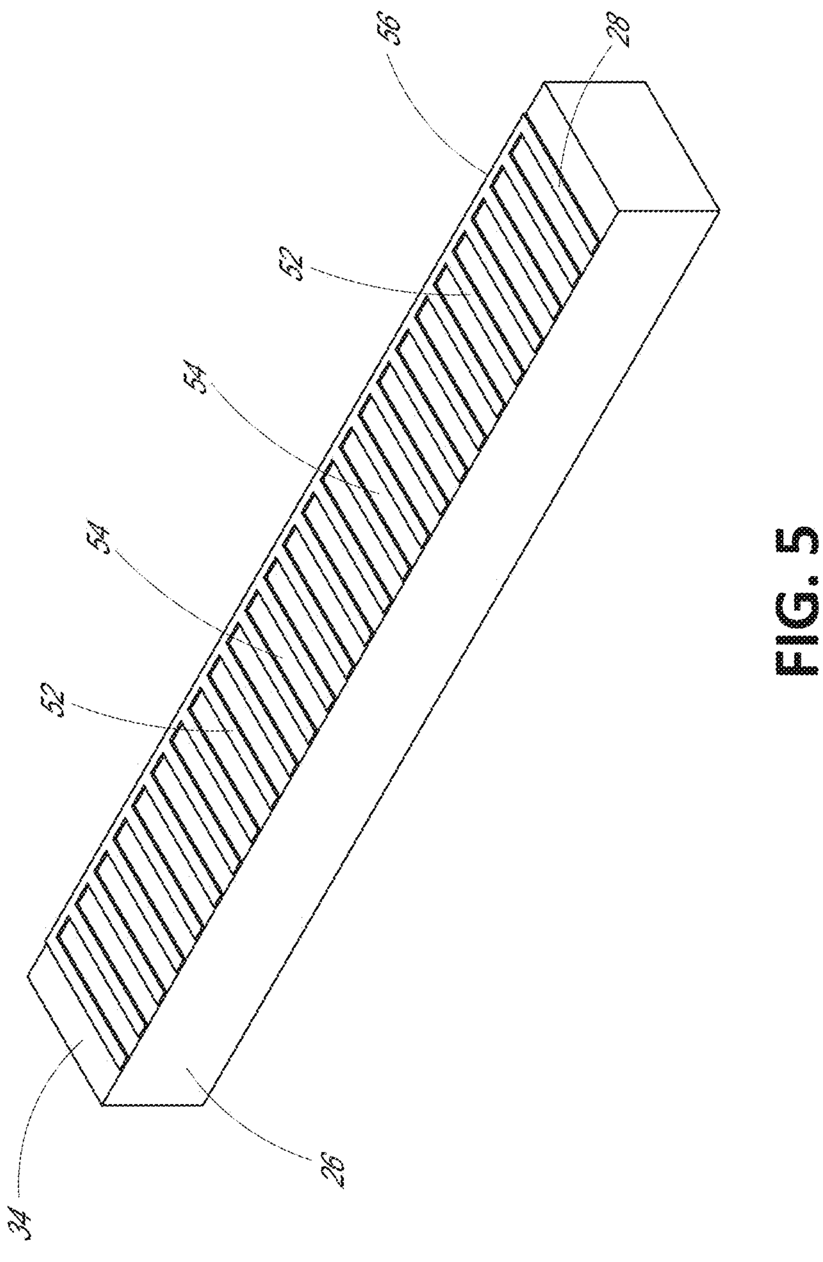
FIG. 5 is a schematic perspective view of a substrate having a flat surface with a metal layer thereon, the metal layer comprising strips of metal separated by gaps. The metal layer may be a layer of metal that is deposited on the substrate and patterned, for example, by etching, or may be a metal preform placed on the substrate.

Another approach to producing the gaps, open spaces or open regions 36 between the semiconductor multilayer 20 and the substrate 26 is to use a patterned metal layer 28. An example of a metal layer 28 that is patterned so as to provide gaps, open spaces, or open regions 36 between the semiconductor multilayer 20 and the heat sink substrate 26 is shown in FIG. 5. The example metal layer 28 comprises a plurality of metal strips 52 separated from each other by spaces 54. Accordingly, the spaces 54 are surrounded on opposite sides by adjacent metal strips 54. Likewise, the metal strips 52 are surrounded on opposite sides by adjacent spaces 54. The strips 52 comprise elongate sections of metal. The metal strips 52 are shown connected by an elongate metal line 56. This elongate metal line 56 is shown as comprising another elongate section of metal extending in a different direction as the metal strips 52 and connected to one end of the strips. In the design shown in FIG. 5, for example, the length of the metal strips 52 extends in a direction that is different than, and in particular orthogonal to, the length of the elongate metal line 56. For example, the length of the metal strips 52 extends in the longitudinal direction (e.g., parallel to the z-axis) while the length of the elongate metal line 56 extends in the transverse direction (e.g., parallel to the x-axis).

Figures 6A, 6B:
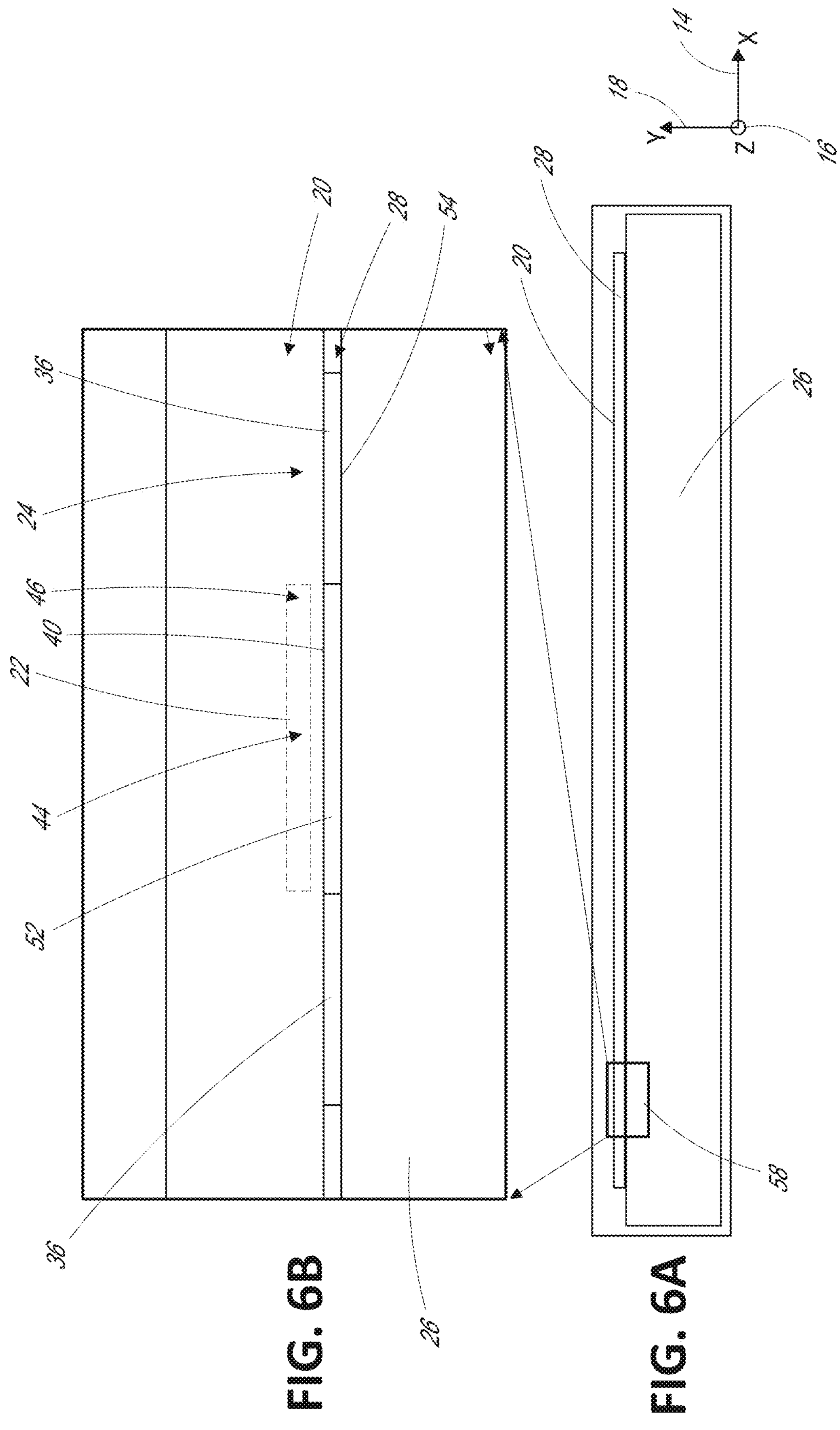
FIG. 6A is a schematic cross-sectional view of a semiconductor multilayer of a laser diode array attached to a substrate having a metal layer such as shown in FIG. 5 thereon so as to produce gaps or open regions or spaces (e.g., air gaps) between the semiconductor multilayer and the substrate.
FIG. 6B is a close-up schematic cross-sectional view of the semiconductor multilayer attached to the substrate having the metal layer thereon.

FIGS. 6A and 6B illustrate a patterned metal layer 28 such as shown in FIG. 5 between the semiconductor multilayer 20 and the heat sink substrate 26. FIG. 6B is a close-up view of a portion 58 of the substrate/heat sink 26 attached to the semiconductor multilayer 20 via the patterned metal layer 28. Because the metal layer 28 comprises a plurality of metal strips 52 separated by spaces 54, gaps, open regions, or open spaces 36 are produced between the semiconductor multilayer 20 and the substrate 26. In various implementations, the metal layer 28 is patterned by etching a layer of metal, is formed with a rigid tool such as a punch, is formed by laser cutting, by photolithographic liftoff using a negative photomask, or is produced by other patterning methods. In some cases, the patterned metal layer 28 is a preform that is subsequently attached to the heat sink substrate 26 and/or the semiconductor multilayer 20.

In various implementations, the metal strips 52 in the patterned metal layer 28, or at least a portion thereof, may be laterally aligned with, for example, are disposed beneath the emission regions 22, or at least portions thereof. Similarly, in various implementations, the spaces 54 between the metal strips 52, or at least portions thereof, may be laterally aligned with, for example, are beneath the non-emitting regions 24, or at least portions thereof. Likewise, in various implementations, the metal strips 52 in the patterned metal layer 28 may have a width and/or pitch similar to, approximating or matching that of the emission regions 22 (e.g., mesas). Similarly, in various implementations, the spaces 54 between the metal strips 52 in the patterned metal layer 28 may have a width and/or pitch similar to, approximating or matching that of the non-emitting regions 24. Additionally, the gaps or open regions 36 may have a width and/or pitch similar to, approximating or matching that of the spaces 54 between the metal strips 52 in the patterned metal layer 28.

Electrical and/or thermal contact may be formed with the laser diode 12 and emission region 22 of the semiconductor multilayer 20 via a contact region 40 of the patterned metal layer 28. As shown, this contact region 40 comprises a surface of the metal strip 52 that contacts the semiconductor multilayer 20. The gaps, open spaces, or open regions, e.g., air gaps, are on opposite sides of this contact region 40. Electrical current and/or voltage may be applied to the laser diode 12 through this contact region 40 of the metal layer 28. Similarly, heat may flow from the emission region 22 (e.g., mesa) of the semiconductor multilayer 20 through this contact region 40 of the metal layer 28. The gaps, open spaces, open regions (e.g. air gaps), may provide thermal isolation wherein heat flows via conduction from the emitter or emission region 22 through the contact region 40 and the metal strip 52 while the gaps, open spaces, open regions operate as barriers to limit conduction from the non-emitting regions 24 directly to the substrate 26.

Such a design may reduce thermal lensing. As discussed above, without subscribing to any particular scientific theory, the temperature falloff from the center 44 of the emission region 22 to the edge 46 of the emission region may be less than if the gap, open space, or open region 36 (and space 54 between the metal strips 52) was not present and the metal layer 28 directly contacted the non-emitting region 24 of the semiconductor multilayer 20. Providing a more direct thermally conductive path from the non-emitting region 24 to the substrate 26 would provide more cooling of the non-emitting region, which would make the temperature falloff within the emission region 22 greater. Conversely, including the gaps, open spaces or open regions 36 positioned to provide barriers to the thermally conductive pathway from the non-emissive region 24 to the substrate 26 limits the cooling of the non-emission regions as well as the cooling at the edge 46 of the emission region 22 and thereby reduces the temperature falloff within the emitter. This reduced fall-off produces less of a gradient in refractive index as well.

Figure 7:
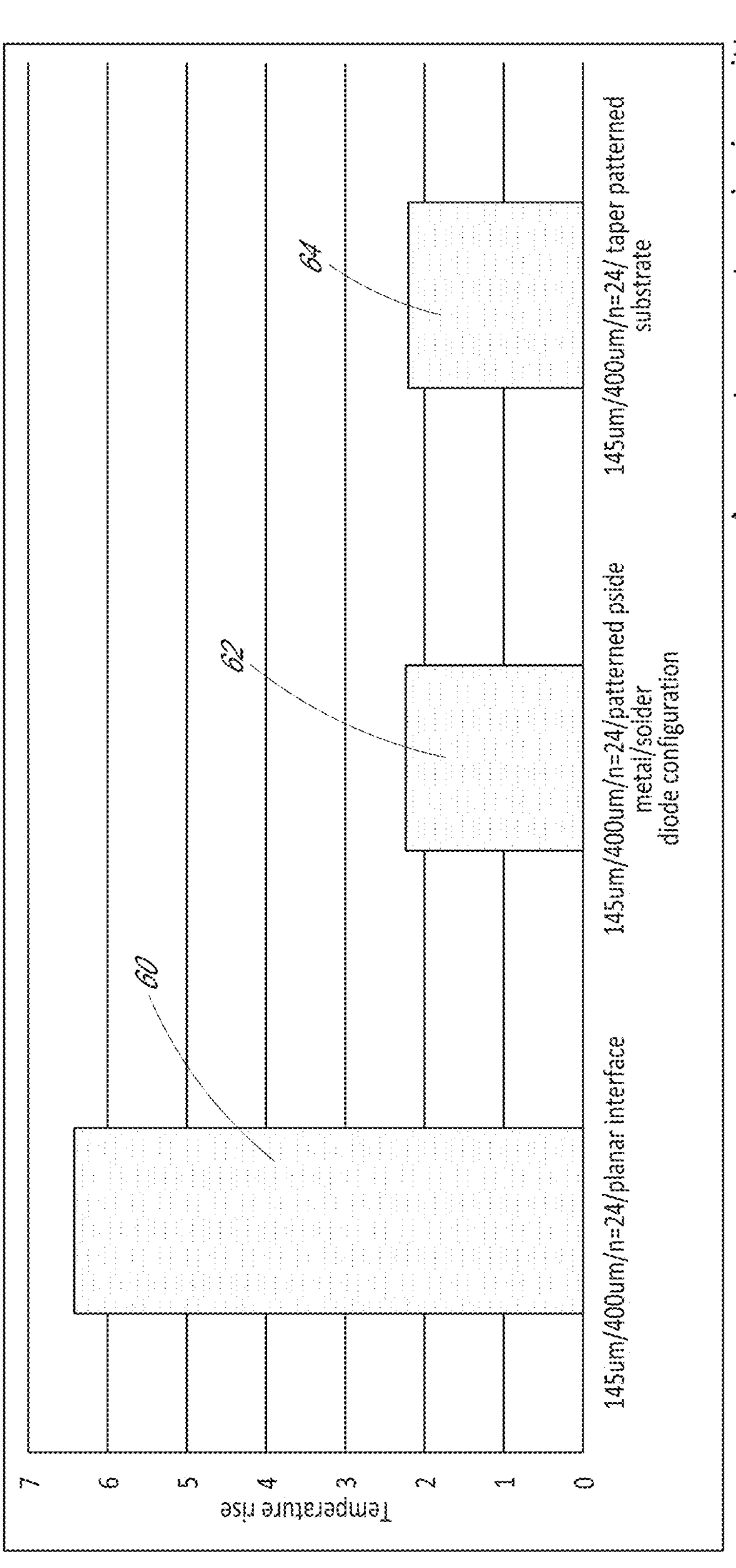
FIG. 7 is a plot of temperature for laser diode arrays with and without air gaps.

FIG. 7, which is a bar graph showing the falloff within the emitter for a variety of different configurations, illustrates the thermal effect of the gaps 36. The column 60 on the far left shows the temperature rise within the emitter or emission region 22 (from edge 46 to center 44) for a design without gaps or open spaces 36, while the column on the far right 64 and in the middle 62 show the temperature rise within the emitter or emission region for a design with air gaps. The middle column 62 corresponds to a design comprising a patterned metal layer 28 (such as shown in FIGS. 5, 6A and 6B) that provide for gaps or open spaces 36 between the semiconductor multilayer 20 and the substrate 26. The far right column 64 corresponds to a design comprising a patterned substrate 26 that provide for gaps or open spaces 36 between the semiconductor multilayer 20 and the substrate. In this design, the substrate 26 includes raised regions 30 having tapered sidewalls 50 such as shown in FIG. 4. As illustrated by FIG. 7, the average temperature rise and similarly the falloff within the emitter or emission region 22 is less when gaps or open spaces 36 are included between the semiconductor multilayer 20 and the substrate 26. The plot shown in FIG. 7 is based on an example design with 24 laser diodes in the laser diode array 10 where the emitter or emission region 22 has a width of 145 micrometers (μm) and a pitch of 400 micrometers (μm).

Figures 8A, 8B:
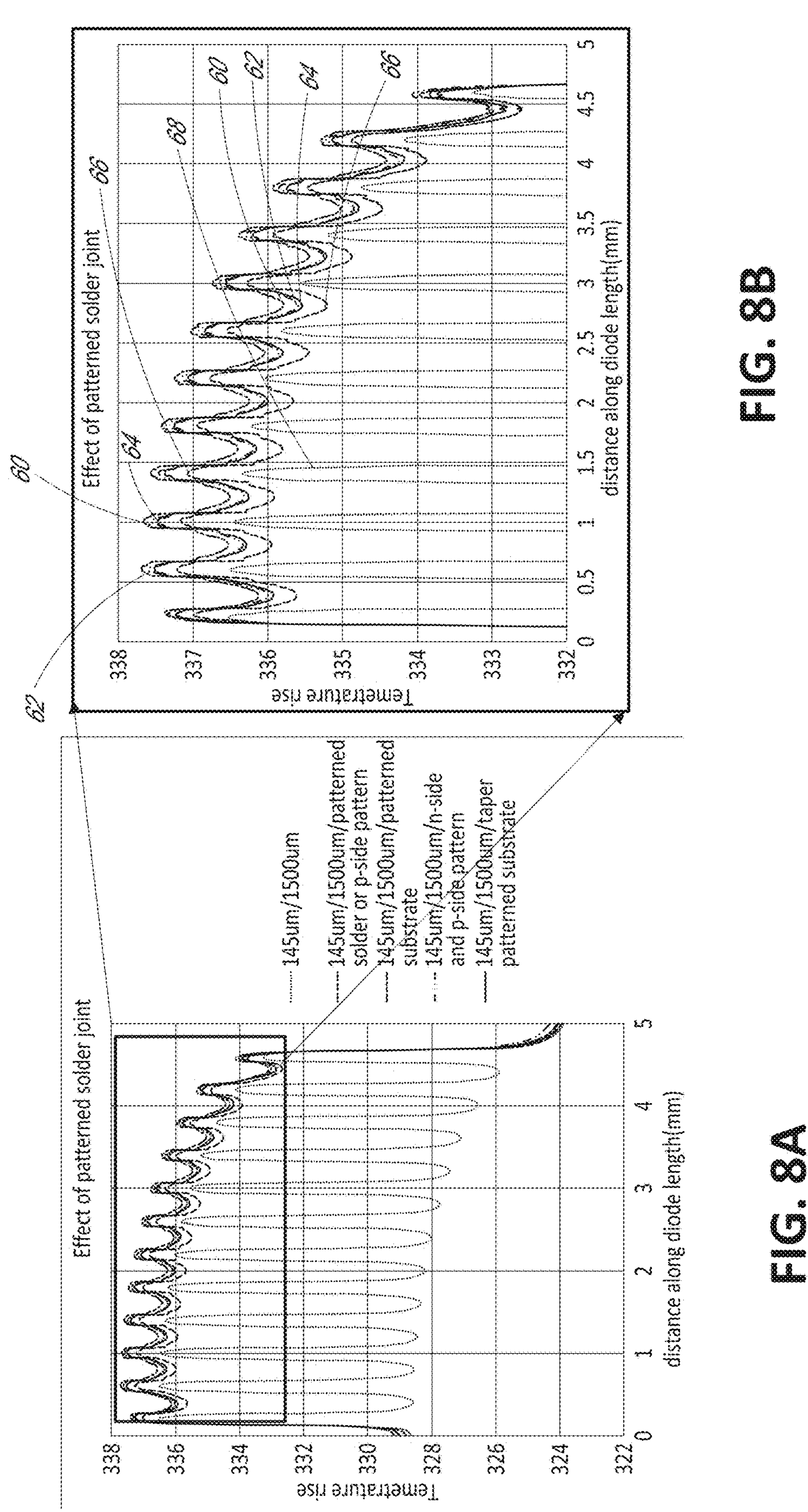
FIG. 8A is a plot of temperature (in Kelvin) versus position showing the temperature falloff within the emission regions of the laser diode array for laser diode arrays with and without air gaps.
FIG. 8B is a close-up of the plot of temperature versus position shown in FIG. 8A.
Figures 9A, 9B:
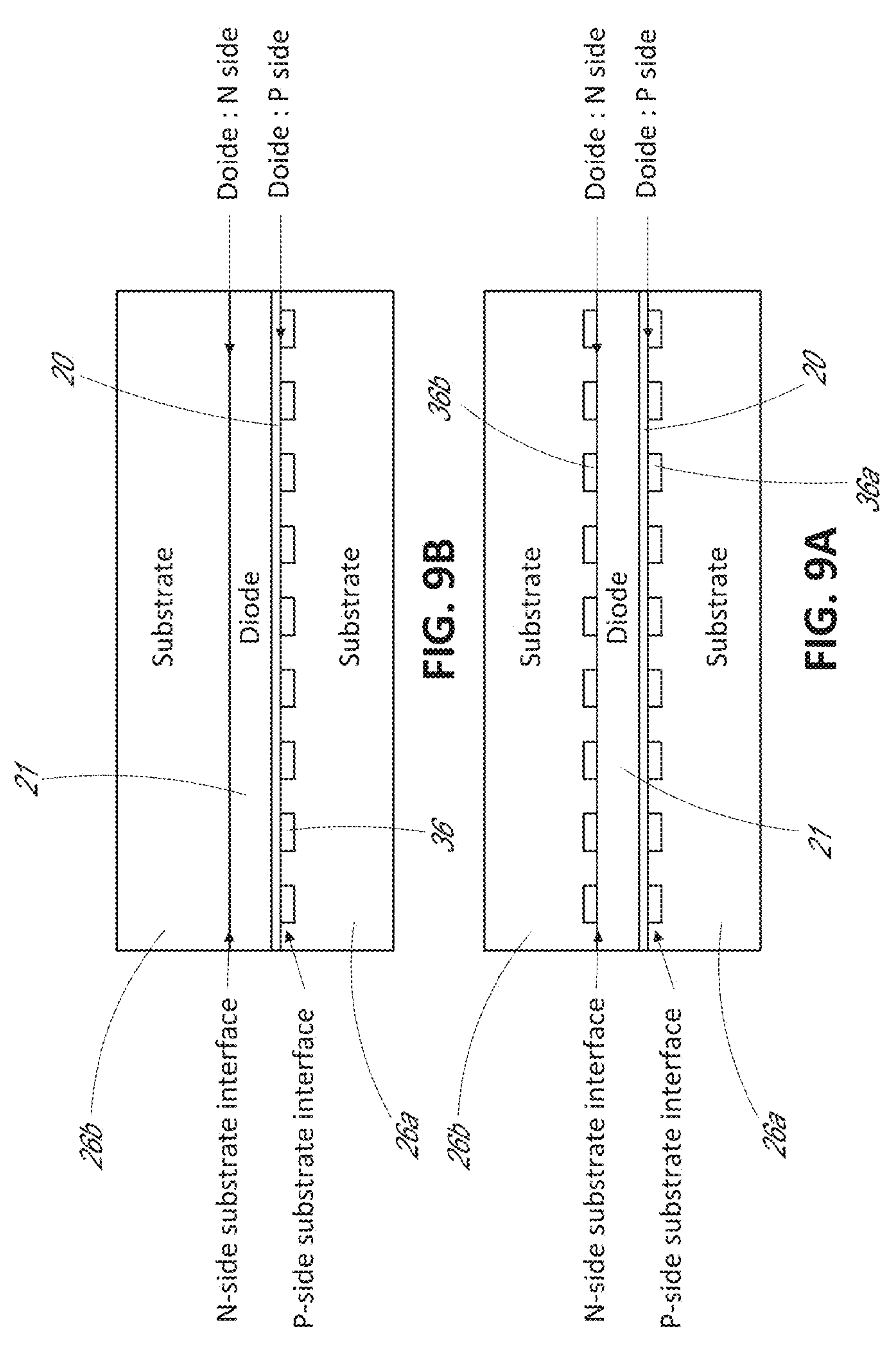
FIG. 9A is a schematic cross-section view depicting an example of a laser diode array with two patterned substrates that operate as heat sinks on opposite sides of the plurality of laser diodes to provide air gaps on both sides of the laser diode array.
FIG. 9B is schematic cross-section view depicting an example of a laser diode array with two substrates that operate as heat sinks on opposites of the plurality of laser diodes, wherein one of the substrates/heat sinks is patterned while the other is not, so as to provide air gaps on one side of the laser diode array.

The plot in FIG. 8A also shows how the fall-off or temperature rise is less for designs with patterned substrates 26 and patterned metal layers 28 that produce air gaps or open regions 36 as compared to having an un-patterned substrate and un-patterned metal layer 28 that does not provide air gaps between the semiconductor multilayer 20 and the substrate. FIG. 8B is a close-up of the plot shown in FIG. 8B. The plot depicted in FIGS. 8A and 8B show the temperature (in Kelvin) across the plurality of emitters or emission regions 22 in the laser diode array 10. In particular, the plot shows temperature versus transverse position along the slow axis of the laser diode array 10 (e.g., parallel to the x-axis 14). The plot shows 12 peaks corresponding to 12 emitters or emission regions 22. Each peak coincides with the center 44 of the emitter or emission region 22. The plot also shows how the temperature falls off with distance from the center 44 of the emitter or emission region 22, for example, at the edge 46 of the emitter or emission region. This falloff is less for the lines associated with designs having patterned substrates/heat sinks 26 or patterned metal layers 28 as compared to the line associated with an un-patterned substrate/heat sink having an un-patterned metal layer. For example, a first line 60 shows the temperature rise, and conversely falloff, for a design having a patterned substrate 26. Additionally, a second line 62 shows the temperature rise, and conversely falloff, for a design having two patterned substrates 26*a*, 26*b* comprising heat sinks on opposite sides of the semiconductor multilayer 20 such as illustrated in FIG. 9A. One of the patterned substrates 26*b* is on the n-side closer to the semiconductor substrate 21 on which the semiconductor multilayer 20 is formed. The other of the patterned substrates 26*a* is on the p-side closer to the semiconductor multilayer 20. A third line 64 shows the temperature rise, and conversely falloff, for a design having a patterned substrate 26 with tapered sidewalls. A fourth line 66 shows the temperature rise, and conversely falloff, for a design having a patterned solder layer 28 or a patterned substrate 26*a* on the p-side closer to the semiconductor multilayer 20 than the semiconductor substrate 21 on which the semiconductor multilayer if formed, as illustrated in FIG. 9B. A fifth line 68 shows the temperature rise, and conversely falloff, for a design without gaps (e.g., air gaps) 36 formed, for example, by patterning the substrate 26 or the metal layer 28. Notably the temperature rise or falloff depicted in the fifth line 68 for the design without air gaps (e.g., without a substrate and/or metal layer patterned to provide air gaps beneath the non-emitting regions 24) is substantially larger than the temperature rise or fall off observable in the first through fourth lines 60, 62, 64, 66, corresponding to designs where air gaps are provided between the semiconductor multilayer 20 and the heat sink substrate 26 beneath the non-emitting regions 24. This data appears consistent with the air gaps beneath the non-emitting regions 24 providing for less fall-off within the emitters or emission regions 22, which will likely induces less thermal lensing. In each of these examples, the emitter width was 145 micrometers (μm) and the pitch for the plurality of emitters in the array 10 was 1500 micrometers (μm).

As referenced above, some designs may include two substrate/heat sinks 26 on opposite sides of the laser diode array. FIG. 9A, for example, shows a laser diode array with two patterned substrates 26*a*, 26*b* that operate as heat sinks on opposite sides of the plurality of laser diodes. In particular, a first patterned substrate 26*a* is shown on a first side of semiconductor multilayer 20 and the substrate 21 on which the semiconductor multilayer is formed. Additionally, a second patterned substrate 26*b* is shown on a second side of the semiconductor multilayer 20 and the substrate 21 on which the semiconductor multilayer is formed. Both substrates/heat sinks 26*a*, 26*b* are patterned thereby providing gaps 36*a*, 36*b* (e.g., air gaps) on both sides of the laser diode array. As illustrated in FIG. 9A, the second patterned substrate 26*b* is closer to the substrate 21 on which the semiconductor multilayer 26 is formed than to the semiconductor multilayer. In comparison, the first patterned substrate 26*a* is closer to the semiconductor multilayer 26 than to the substrate 21 on which the semiconductor multilayer is formed. In the example shown, the substrate 21 on which the semiconductor multilayer 20 is formed is on the n-side of the diode (e.g., this semiconductor substrate may be n-doped). Accordingly, the second patterned substrate 26*b* is shown on the n-side of the laser diodes, while the first patterned substrate 26*a* is shown on the p-side of the laser diodes. The interfaces of the first and second patterned substrate 26*a*, 26*b, p*-side and n-side, respectively, are also referenced in the schematic drawing. Other configurations, however, are possible. In various implementations a metal layer is disposed between the second substrate/heat sink 26*b* and the semiconductor multilayer 26 and/or the substrate 21 on which said semiconductor multilayer is formed. This metal layer may provide for increased thermal conduction between the semiconductor multilayer 26 and/or the substrate 21 on which said semiconductor multilayer is formed and the second substrate/heat sink 26*b*.

FIG. 9B is an example of a laser diode array with two substrates 26*a*, 26*b* that operate as heat sinks on opposites of the plurality of laser diodes, wherein one of the substrates/heat sinks is patterned while the other is not, so as to provide air gaps on one side of the laser diode array. In particular, a first patterned substrate 26*a* is shown on a first side of semiconductor multilayer 20 and the substrate 21 on which the semiconductor multilayer is formed. Additionally, a second substrate 26*b*, which is not patterned to provide gaps (e.g., air gaps), is shown on a second side of the semiconductor multilayer 20 and the substrate 21 on which the semiconductor multilayer is formed. As schematically illustrated, the first patterned substrate/heat sink 26*a* is patterned thereby producing gaps 36*a* (e.g., air gaps) between the first substrate/heat sink and the semiconductor multilayer 20. As illustrated in FIG. 9B, the second substrate 26*b* is closer to the substrate 21 on which the semiconductor multilayer 26 is formed than to the semiconductor multilayer. In comparison, the first patterned substrate 26*a* is closer to the semiconductor multilayer 26 than to the substrate 21 on which the semiconductor multilayer is formed. In the example shown, the substrate 21 on which the semiconductor multilayer 20 is formed is on the n-side of the diode (e.g., this semiconductor substrate may be n-doped). Accordingly, the second substrate 26*b* is shown on the n-side of the laser diodes, while the first patterned substrate 26*a* is shown on the p-side of the laser diodes. The interfaces of the first and second substrates/heat sinks 26*a*, 26*b*, p-side and n-side, respectively, are also referenced in the schematic drawing. Other configurations, however, are possible. In various implementations, a metal layer is disposed between the second substrate/heat sink 26*b* and the semiconductor multilayer 26 and/or the substrate 21 on which said semiconductor multilayer is formed. This metal layer may provide for increased thermal conduction between the semiconductor multilayer 26 and/or the substrate 21 on which said semiconductor multilayer is formed and the second substrate/heat sink 26*b*. In some implementations, this metal layer may be patterned to create air gaps between the second substrate/heat sink 26*b* and the semiconductor multilayer 26 and/or the substrate 21 on which said semiconductor multilayer is formed. In other implementations, this metal layer is not patterned to create air gaps between the second substrate/heat sink 26*b* and the semiconductor multilayer 26 and/or the substrate 21 on which said semiconductor multilayer is formed.

In various implementations described herein the gaps, open spaces, or open regions comprise air gaps or air filled open spaces or air filled open regions. However, the gaps, open spaces or open regions may include a gas or mixture of gases other than air such as inert gas like nitrogen. Additionally, in certain possible implementations, the gaps, open spaces or open regions may comprise vacuum.

In various implementations, the gaps, open spaces, or open regions may have a width in a range of from 10 to 400 microns. The gaps, open spaces, or open regions may have a height in a range of from 0.1 to 10 microns. The gaps, open spaces, or open regions may be separated from each other by a distance in a range of from 10 to 200 microns. The gaps, open spaces, or open regions may have a pitch in a range from 10 to 100 microns or from 10 to 600 microns. Dimensions outside these ranges (e.g., larger or smaller), however, are possible.

As discussed above, in various implementations, the metal layer whether patterned or not comprises a solder layer, with the metal comprising solder.

EXAMPLES

This disclosure provides various examples of sample cells for optical analysis. Some such examples include but are not limited to the following examples.

Example 1: A laser diode array comprising:

a semiconductor multilayer comprising a plurality of emission regions arranged in a linear array, consecutive emission regions separated from each other by non-emitting regions of said semiconductor multilayer;

a metal layer;

a substrate disposed with respect to said semiconductor multilayer such that said metal layer is between said semiconductor multilayer and said substrate, said substrate providing a heat sink for at least portions of said semiconductor multilayer; and a plurality of gaps between said semiconductor multilayer and said substrate, said gaps disposed between contact regions, respective ones of said contact regions forming electrical contact with respective ones of said emission regions of said semiconductor multilayer, respective ones of said contact regions forming thermally conductive pathways with respective ones of said emission regions, individual ones of said thermally conductive pathways having said gaps on opposite sides thereof.

Example 2: The laser diode array of Example 1, wherein said gaps comprises air gaps.

Example 3: The laser diode array of any of Examples 1 or 2, wherein said substrate comprises a plurality of raised regions separated by lower regions disposed therebetween, said gaps located between said raised regions above said lower regions.

Example 4: The laser diode array of Example 3, wherein said metal layer covers said raised regions.

Example 5: The laser diode array of Example 4, wherein said metal layer covers said lower regions between said raised regions.

Example 6: The laser diode array of Example 4, wherein said lower regions are mostly not covered by metal.

Example 7: The laser diode array of Example 1 or 2, wherein said substrate is flat and said metal layer comprises strips with said gaps located between said strips.

Example 8: The laser diode array of Example 7, wherein said strips are connected by a metal line.

Example 9: The laser diode array of Examples 1, 2, 7 or 8, wherein said metal layer comprises a patterned metal preform.

Example 10: The laser diode array of any of the examples above, wherein said semiconductor multilayer comprises p doped semiconductor material.

Example 11: The laser diode array of any of the examples above, wherein said semiconductor multilayer comprises III-V semiconductor.

Example 12: The laser diode array of any of the examples above, further comprising a semiconductor substrate on which said semiconductor multilayer is formed.

Example 13: The laser diode array of any of Example 12, wherein said semiconductor substrate on which said semiconductor multilayer is formed comprises III-V semiconductor.

Example 14: The laser diode array of any of Example 12 or 13, wherein said semiconductor substrate on which said semiconductor multilayer is formed comprises n-doped semiconductor.

Example 15: The laser diode array of any of the examples above, wherein said plurality of non-emitting regions have a pitch, and said plurality of gaps have a pitch that is equal to said pitch of said non-emitting regions.

Example 16: The laser diode array of any of the examples above, wherein said plurality of emitting regions have a pitch, and said plurality of gaps have a pitch that is equal to said pitch of said emitting regions.

Example 17: The laser diode array of any of the examples above, wherein said plurality of non-emitting regions have an average width, and said plurality of gaps have an average width that is equal to the average width of said non-emitting regions.

Example 18: The laser diode array of any of the example above, wherein said plurality of contacting regions have an average width, and said plurality of emitting regions have an average width that is equal to said average width of said contact regions.

Example 19: The laser diode array of any of the examples above, wherein said plurality of non-emitting regions have a pitch in the range of 10 to 600 microns.

Example 20: The laser diode array of any of the examples above, wherein said plurality of emitting regions have a pitch in the range of 10 to 600 microns.

Example 21: The laser diode array of any of the examples above, wherein said plurality of gaps have a pitch in the range of 10 to 100 microns.

Example 22: The laser diode array of any of the examples above, wherein said plurality of gaps have an average height the range of 0.1 to 10 microns.

Example 23: The laser diode array of any of the examples above, wherein said plurality of non-emitting regions have an average width in the range of 10 to 400.

Example 24: The laser diode array of any of the examples above, wherein said plurality of emitting regions have an average width in the range of 10 to 200 microns.

Example 25: The laser diode array of any of the examples above, wherein said plurality of gaps have an average width in the range of 10 to 400 microns.

Example 26: The laser diode array of any of Examples 1 or 3-25, wherein said gaps comprises vacuum.

Example 27: The laser diode array of any of Examples 1 or 3-25, wherein said gaps are filled with gas.

Example 28: The laser diode array of any of the examples above, wherein said metal layer comprises a solder layer.

Example 29: The laser diode array of any of the examples above, further comprising an additional substrate providing a heat sink for at least portions of said semiconductor multilayer, said additional substrate disposed on an opposite side of the semiconductor multilayer as the other substrate providing a heat sink for at least portions of said semiconductor multilayer.

Example 30: The laser diode array of Example 29, further comprising a plurality of gaps between said additional substrate providing a heat sink for at least portions of said semiconductor multilayer and said semiconductor multilayer.

ADDITIONAL EXAMPLES

Example 1: A laser diode array comprising:

a semiconductor multilayer comprising a plurality of emission regions arranged in a linear array, consecutive emission regions separated from each other by non-emitting regions of said semiconductor multilayer;

a solder layer;

a substrate disposed with respect to said semiconductor multilayer such that said solder layer is between said semiconductor multilayer and said substrate, said substrate providing a heat sink for at least portions said semiconductor multilayer; and a plurality of gaps between said semiconductor multilayer and said substrate, said gaps disposed between contact regions, respective ones of said contact regions forming electrical contact with respective ones of said emission regions of said semiconductor multilayer, respective ones of said contact regions forming thermally conductive pathways with respective ones of said emission regions, individual ones of said thermally conductive pathways having said gaps on opposite sides thereof.

Example 2: The laser diode array of Example 1, wherein said gaps comprises air gaps.

Example 3: The laser diode array of any of Examples 1 or 2, wherein said substrate comprises a plurality of raised regions separated by lower regions disposed therebetween, said gaps located between said raised regions above said lower regions.

Example 4: The laser diode array of Example 3, wherein said solder layer covers said raised regions.

Example 5: The laser diode array of Example 4, wherein said solder layer covers said lower regions between said raised regions.

Example 6: The laser diode array of Example 4, wherein said lower regions are mostly not covered by solder.

Example 7: The laser diode array of Example 1 or 2, wherein said substrate is flat and said solder layer comprises strips with said gaps located between said strips.

Example 8: The laser diode array of Example 7, wherein said strips are connected by a solder line.

Example 9: The laser diode array of Examples 1, 2, 7 or 8, wherein said solder layer comprises a patterned solder preform.

Example 10: The laser diode array of any of the examples above, wherein said semiconductor multilayer comprises p doped semiconductor material.

Example 11: The laser diode array of any of the examples above, wherein said semiconductor multilayer comprises III-V semiconductor.

Example 12: The laser diode array of any of the examples above, further comprising a semiconductor substrate on which said semiconductor multilayer is formed.

Example 13: The laser diode array of Example 12, wherein said semiconductor substrate on which said semiconductor multilayer is formed comprises III-V semiconductor.

Example 14: The laser diode array of Example 12 or 13, wherein said semiconductor substrate on which said semiconductor multilayer is formed comprises n-doped semiconductor.

Example 15: The laser diode array of any of the examples above, wherein said plurality of non-emitting regions have a pitch, and said plurality of gaps have a pitch that is equal to said pitch of said non-emitting regions.

Example 16: The laser diode array of any of the examples above, wherein said plurality of emitting regions have a pitch, and said plurality of gaps have a pitch that is equal to said pitch of said emitting regions.

Example 17: The laser diode array of any of the examples above, wherein said plurality of non-emitting regions have an average width, and said plurality of gaps have an average width that is equal to the average width of said non-emitting regions.

Example 18: The laser diode array of any of the example above, wherein said plurality of contacting regions have an average width, and said plurality of gaps have an average width that is equal to said average width of said contact regions.

Example 19: The laser diode array of any of the examples above, wherein said plurality of non-emitting regions have a pitch in the range of 10 to 600 microns.

Example 20: The laser diode array of any of the examples above, wherein said plurality of emitting regions have a pitch in the range of 10 to 600 microns.

Example 21: The laser diode array of any of the examples above, wherein said plurality of gaps have a pitch in the range of 10 to 600 microns.

Example 22: The laser diode array of any of the examples above, wherein said plurality of gaps have an average height the range of 0.1 to 100.

Example 23: The laser diode array of any of the examples above, wherein said plurality of non-emitting regions have an average width in the range of 10 to 400 microns.

Example 24: The laser diode array of any of the examples above, wherein said plurality of emitting regions have an average width in the range of 10 to 200 microns.

Example 25: The laser diode array of any of the examples above, wherein said plurality of gaps have an average width in the range of 10 to 400 microns.

Example 26: The laser diode array of any of Examples 1 or 3-25, wherein said gaps comprises vacuum.

Example 27: The laser diode array of any of Examples 1 or 3-25, wherein said gaps are filled with gas.

Example 28: The laser diode array of any of the examples above, further comprising an additional substrate providing a heat sink for at least portions of said semiconductor multilayer, said additional substrate disposed on an opposite side of the semiconductor multilayer as the other substrate providing a heat sink for at least portions of said semiconductor multilayer.

Example 29: The laser diode array of Example 28, further comprising a plurality of gaps between said an additional substrate providing a heat sink for at least portions of said semiconductor multilayer and said semiconductor multilayer.

Although the description above contains many details and specifics, these should not be construed as limiting the scope of the invention but as merely providing illustrations of some of the presently preferred embodiments of this invention. Other implementations, enhancements and variations can be made based on what is described and illustrated in this patent document. The features of the embodiments described herein may be combined in all possible combinations. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Moreover, the separation of various system components in the embodiments described above should not be understood as requiring such separation in all embodiments.

Therefore, it will be appreciated that the scope of the present invention fully encompasses other embodiments which may become obvious to those skilled in the art. In the claims, reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

What is claimed is:

1. A laser diode array comprising:

a semiconductor multilayer comprising a plurality of emission regions arranged in a linear array, consecutive emission regions separated from each other by non-emitting regions of said semiconductor multilayer;

a metal layer;

a substrate disposed with respect to said semiconductor multilayer such that said metal layer is between said semiconductor multilayer and said substrate, said substrate providing a heat sink for at least portions said semiconductor multilayer; and a plurality of gaps between said semiconductor multilayer and said substrate, said gaps disposed between contact regions, respective ones of said contact regions forming electrical contact with respective ones of said emission regions of said semiconductor multilayer, respective ones of said contact regions forming thermally conductive pathways with respective ones of said emission regions, individual ones of said thermally conductive pathways having said gaps on opposite sides thereof, wherein said semiconductor multilayer has top and bottom surfaces, said bottom surface closer to said substrate than said top surface, wherein said bottom surface of the semiconductor multilayer is flat across a width extending across a plurality of emission and non-emitting regions.

2. The laser diode array of claim 1, wherein said gaps comprise air gaps.

3. The laser diode array of claim 1, wherein said substrate comprises a plurality of raised regions separated by lower regions disposed therebetween, said gaps located between said raised regions above said lower regions.

4. The laser diode array of claim 3, wherein said metal layer covers said raised regions.

5. The laser diode array of claim 4, wherein said metal layer covers said lower regions between said raised regions.

6. The laser diode array of claim 4, wherein said lower regions are mostly not covered by metal.

7. The laser diode array of claim 1, wherein said substrate is flat and said metal layer comprises strips with said gaps located between said strips.

8. The laser diode array of claim 7, wherein said strips are connected by a metal line.

9. The laser diode array of claim 1, wherein said bottom surface of the semiconductor multilayer is flat across a width in the range of from 250 micrometers to 1 centimeter.

10. The laser diode array of claim 1, wherein said semiconductor multilayer comprises III-V semiconductor.

11. The laser diode array of claim 1, further comprising a semiconductor substrate on which said semiconductor multilayer is formed.

12. The laser diode array of claim 1, wherein said plurality of non-emitting regions have a pitch, and said plurality of gaps have a pitch that is equal to said pitch of said non-emitting regions.

13. The laser diode array of claim 1, wherein said plurality of emitting regions have a pitch, and said plurality of gaps have a pitch that is equal to said pitch of said emitting regions.

14. The laser diode array of claim 1, wherein said plurality of non-emitting regions have an average width, and said plurality of gaps have an average width that is equal to the average width of said non-emitting regions.

15. The laser diode array of claim 1, wherein said plurality of contact regions have an average width, and said plurality of gaps have an average width that is equal to said average width of said contact regions.

16. The laser diode array of claim 1, wherein said gaps comprise vacuum.

17. The laser diode array of claim 1, wherein said gaps are filled with gas.

18. The laser diode array of claim 1, wherein said metal layer comprises a solder layer.

19. The laser diode array of claim 1, further comprising an additional substrate providing a heat sink for at least portions of said semiconductor multilayer, said additional substrate disposed on an opposite side of the semiconductor multilayer as the other substrate providing a heat sink for at least portions of said semiconductor multilayer, said additional substrate being patterned on the side thereof closer to said semiconductor multilayer, said additional substrate being patterned to provide a plurality of trenches surrounded on opposite sides by raised regions.

20. The laser diode array of claim 19, wherein said plurality of trenches provides a plurality of gaps between said additional substrate providing a heat sink for at least portions of said semiconductor multilayer and said semiconductor multilayer.

* * * * *